(12) United States Patent
Tai

(10) Patent No.: US 7,659,783 B2
(45) Date of Patent: Feb. 9, 2010

(54) SYSTEM AND METHOD FOR PHASE-LOCKED LOOP (PLL) FOR HIGH-SPEED MEMORY INTERFACE (HSMI)

(75) Inventor: Gwo-Chung Tai, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 69 days.

(21) Appl. No.: 11/778,353

(22) Filed: Jul. 16, 2007

(65) Prior Publication Data

US 2009/0021310 A1    Jan. 22, 2009

(51) Int. Cl.
*H03L 7/00* (2006.01)

(52) U.S. Cl. .............................. 331/17; 331/16; 331/46; 331/57; 331/60; 331/108 B; 331/135; 331/177 R; 375/375; 375/376

(58) Field of Classification Search ................ 331/10, 331/12, 16, 18, 34, 2, 7, 45, 46, 48, 49, 51, 331/55, 57, 58, 60, 61, 104, 107 R, 175, 176, 331/17, 44, 108 B, 135, 177 R; 327/144–147, 327/157, 158, 295; 375/373–376
See application file for complete search history.

(56) References Cited

U.S. PATENT DOCUMENTS

| | | | | |
|---|---|---|---|---|
| 5,428,317 A | * | 6/1995 | Sanchez et al. | ............. 331/1 A |
| 5,663,665 A | * | 9/1997 | Wang et al. | ................... 327/3 |
| 5,786,732 A | * | 7/1998 | Nielson | ...................... 331/1 A |
| 6,011,822 A | * | 1/2000 | Dreyer | ...................... 327/158 |
| 6,020,773 A | * | 2/2000 | Kan et al. | .................... 327/271 |
| 6,154,071 A | * | 11/2000 | Nogawa | ...................... 327/156 |
| 6,191,660 B1 | * | 2/2001 | Mar et al. | ..................... 331/111 |
| 6,326,812 B1 | * | 12/2001 | Jefferson | ...................... 326/93 |
| 6,385,265 B1 | * | 5/2002 | Duffy et al. | ................. 375/374 |
| 6,512,420 B1 | * | 1/2003 | Eker et al. | ..................... 331/57 |
| 6,774,689 B1 | * | 8/2004 | Sudjian | ...................... 327/158 |
| 6,885,253 B2 | * | 4/2005 | Ahmed | ........................ 331/45 |
| 6,952,123 B2 | * | 10/2005 | Kizer et al. | ................. 327/147 |

(Continued)

OTHER PUBLICATIONS

Ali Hajimiri, et al., "A General Theory of Phase Noise in Electrical Oscillators", IEEE Journal of Solid-State Circuits, vol. 33, No. 2, Feb. 1998, pp. 179-194.

(Continued)

*Primary Examiner*—Arnold Kinkead
*Assistant Examiner*—Richard Tan
(74) *Attorney, Agent, or Firm*—Sawyer Law Group P.C.

(57) ABSTRACT

A phase-locked loop (PLL) to provide clock generation for high-speed memory interface is presented as the innovate PLL (IPLL). The IPLL architecture is able to tolerate external long loop delay without deteriorating jitter performance. The IPLL comprises in part a common mode feedback circuit with a current mode approach, so as to minimize the effects of mismatch in charge-pump circuit, for instance. The voltage-controlled oscillator (VCO) of the IPLL is designed using a mutually interpolating technique generating a 50% duty clock output, beneficial to high-speed double data rate applications. The IPLL further comprises loop filter voltages that are directly connected to each VCO cell of the IPLL. Conventional voltage-to-current (V-I) converter between loop filter and VCO is hence not required. A tight distribution of VCO gain curves is therefore obtained for the present invention across process corners and varied temperatures.

38 Claims, 11 Drawing Sheets

U.S. PATENT DOCUMENTS

| | | | |
|---|---|---|---|
| 7,181,180 B1 * | 2/2007 | Teo et al. | 455/260 |
| 2005/0110579 A1 * | 5/2005 | Raha | 331/16 |
| 2006/0033591 A1 * | 2/2006 | Kim et al. | 331/185 |
| 2006/0208779 A1 * | 9/2006 | Lin et al. | 327/158 |
| 2006/0255868 A1 * | 11/2006 | May | 331/57 |
| 2007/0115950 A1 * | 5/2007 | Karaoguz et al. | 370/356 |

OTHER PUBLICATIONS

Lizhong Sun, et al., "A 1.25-GHz 0.35-μm Monolithic CMOS PLL Based on a Multiphase Ring Oscillator", IEEE Journal of Solid-State Circuits, vol. 36, No. 6, Jun. 2001, pp. 910-916.

* cited by examiner

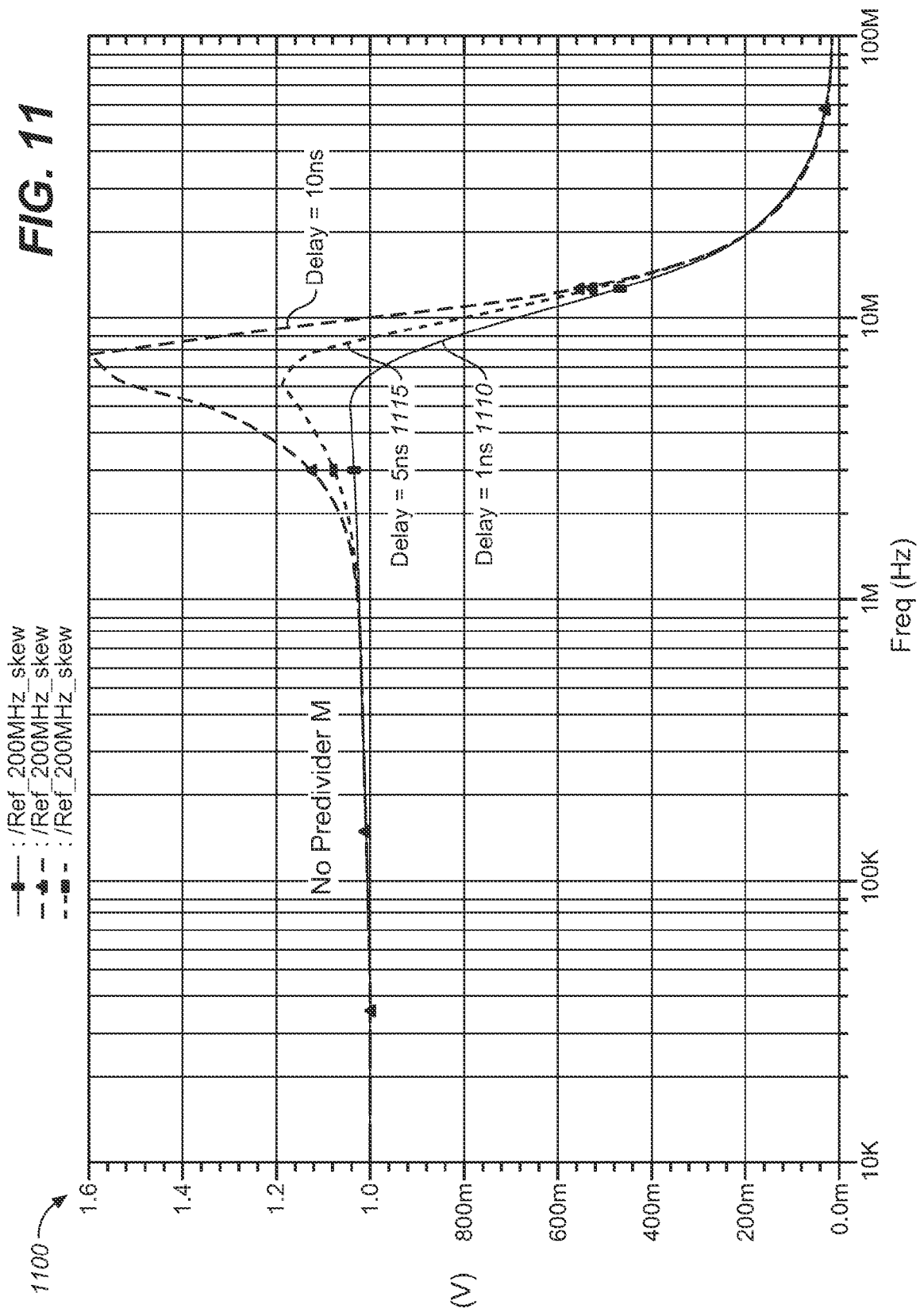

SYSTEM AND METHOD FOR PHASE-LOCKED LOOP (PLL) FOR HIGH-SPEED MEMORY INTERFACE (HSMI)

FIELD OF THE INVENTION

The present invention relates generally to electronics circuits, and more specifically to a digital phase-locked loop (PLL) for application in high-speed memory interfaces (HSMIs).

BACKGROUND OF THE INVENTION

Phase-locked loops (PLLs) are an integral part of many electronics circuits and are particularly important in communication circuits. For example, many digital systems use clock signals to trigger synchronous circuits (e.g., flip-flops). Clock signals are common in wireless devices (such as but not limited to cellular phones for example) via their digital circuitry, where the transmitter and receiver systems use local oscillator (LO) signals for frequency conversions. Typically, it is the clock and LO signals that are often generated with PLLs.

Further, PLLs have a broad range of uses and applications ranging from microprocessors to memory devices (DRAM and DDR) and to clock and data recovery in a communication system, for example.

As used herein, it is understood that the term microprocessor is intended to mean but not be exclusively limited to a processor for performing processing typically implemented as a microchip, a logic chip, in a logic method, and similar. The microprocessor is intended and designed to perform arithmetic and logic operations that make use of small number-holding areas called registers, operatively executed by a set of instructions that are part of the microprocessor's design. While a microprocessor relies on instructions for execution, it is not limited to using instructions from the basic input/output system (BIOS) that may come with a related computer as part of its memory or an application program.

As used herein, it is further understood that DRAM is intended mean Dynamic Random Access Memory (DRAM) and DDR is intended to mean DDR SDRAM (Double Data Rate SDRAM). At present, DRAM is the most common kind of random access memory (RAM) for personal computers (PCs) and workstations, where the random access aspects are intended to mean that the PC processor can access any part of the memory or data storage space directly rather than having to proceed sequentially from some starting place. DRAM is dynamic in that, unlike static RAM (which may also be referred to as Static Random Access Memory or SRAM), it needs to have its storage cells refreshed or given a new electronic charge every few milliseconds. Contradistinctively, DDR SDRAM is synchronous dynamic RAM (SDRAM) that improves memory clock speed as it activates output on both the rising and falling edge of the system clock rather than exclusively on the rising edge.

Recently, a PLL for clock signal generation has been an essential design building block in integrated circuit systems. The quality of clock signal generation, also used herein as "clock" or "clocks" (i.e., a clock signal is a signal used to relate the activities of two or more circuits, such as synchronization, in which the signal typically oscillates between a high and a low state, with a given duty cycle.), generated by a PLL plays an important role in determining the performance of a circuit and its system. Especially, in today's applications, the technology trend of higher frequency and faster data processing rate results in using both rising and falling edges of the clock. Furthermore, in recent times, it is becoming more common for a system to operate with multiple phases of a clock simultaneously.

As a result, to better the possibility of effective operation, operative restraints placing a strict imposition on the duty cycle of such clocks should be encouraged. For instance, in a given system, duty clocks operating at 50% duty cycle do support a broader timing margin and hence will likely results in improved system performance, improved tolerance to temperature and semiconductor process variations, and the like.

FIG. 1 depicts a conventional PLL architecture used in a typical system with a memory interface, collectively 100.

In FIG. 1, a system PLL 105 generates system clocks at 110 for an internal memory controller 115. The internal memory controller 115 has a built-in digital delay-locked loop (DLL) circuit for clock phase adjustment. The system clock 110, at the same time, is also the input reference clock to the de-skew PLL 120, following pass through at the buffer 125 which has an adjustable time delay. Typically, in the conventional PLL, the de-skew PLL typically "zeroes out" the input-output (I/O) path delay such that external memories, double-data rate (DDR) memory and/or synchronous random access memory (SDRAM), 129, are triggered simultaneously as it is at the memory controller 115. More specifically, $CK_{IN}$ and $CK_{DDR}$, 130 and 135 respectively in FIG. 1, are precisely aligned in time. The buffer 125 may typically be used to extend the deskew time range.

As becomes apparent from FIG. 1, there are two critical limitations, in addition to a series of significant deficiencies, in this conventional PLL architecture, especially when viewed with particularity to high-speed applications.

Firstly, the duty cycle of the clock from de-skew PLL 120 needs to be maintained to as close to 50% as is possible so as to better the timing margin and tolerance for a DDR memory environment, 129. This is required since both rising and falling edges of the clock are being employed to trigger DDR 129. Secondly, total loop delay time that $CK_{OUT}$ experiences, including clock buffers, package, board trace, capacitive loading, and I/O transmitter (TX) 140 and receiver (RX) 145, may exceed a clock period in high-speed operation. Therefore, since pole location of the de-skew PLL is nonlinearly affected by the total loop delay time, as loop delay time is increased, the phase margin of de-skew PLL is consequently reduced.

Unfortunately, conventional PLLs usually include a voltage-to-current (V-I) converter between the loop filter (LF) and the voltage-controlled oscillator (VCO). In a conventional PLL, the V-I converter serves the purpose of converting the LF voltage to VCO biasing current, such that the VCO oscillation frequency is adjusted by the loop filter voltage. An unintended result is that the V-I converter could introduce linearity and dynamic range issues to the overall PLL response. Additionally, the V-I converter will likely require additional power consumption and die area.

Similarly, when applying a conventional PLL for deskewing purposes, the conventional PLL in unable to tolerate long loop delay times, such as those that may be for a clock period or more, for example. One known step to this overcome this issue is to include a large loop capacitor with the conventional PLL in order to stabilize the closed-loop response. However, even with this added step, the resulting loop delay time of the conventional PLL with the large loop capacitor may change with temperature and the specific process, creating additional implications such as then requiring a large loop filter capacitor.

Further, it is known that a conventional PLL uses a replica circuit for VCO swing control. Although the use of such a replica circuit is not deficient in the operation of the conventional PLL, the replica circuit serves to provide a control voltage which imposes constant VCO swing amplitude for different oscillation frequencies, temperatures, and process corners. These provisions from this replica circuit for a fixed swing, for example, thereby create the situation that the conventional PLL may lack symmetrical VCO output waveform; this deficiency, which introduces a DC-component and consequently can be up-converted nonlinearly to become high-frequency jitter, is clearly problematic.

Additionally, since a typical conventional PLL employs both a V-I converter and a replica circuit, the total power delivered to V-I converter plus VCO and the replica circuit is dependent on the oscillation frequency. Given such a dependency, it is well-known that consequently, the VCO gain curves for a conventional PLL may exhibit a large variation as between different temperatures and process corners.

Further, in a conventional PLL, the VCO has only one loop-back constraint for each clock phase in the VCO ring oscillator. As a result, the duty cycle distortion in each clock phase becomes unavoidable for high frequency operations, in part since a process mismatch exists between each VCO cell. To overcome this problem, it is common to include a duty cycle corrector circuit in the conventional PLL. However, this additional inclusion can create additional burdens, costs and complexities in the application of the conventional PLL.

The problems described herein are serious and are well-known in the art. It is therefore desirous to provide a PLL that is able to generate 50% duty cycle clocks, regardless of temperature and process variations. It is also desirous to provide a PLL that is able to tolerate external long loop delay time when applying to high-speed memory interfaces. Further, of particular concern and need is overcoming the limitations of the art by determining a phase-locked loop for generation of clocks having a 50% duty cycle for application in high-speed memory interface having an external long loop delay, while avoiding a mandatory requirement for a V-I circuit, effectively keeping the closed-loop phase margin insensitive to loop delay time, not necessitating a replica circuit, and providing a PLL having an improved distribution of VCO gain curves.

SUMMARY OF THE INVENTION

The present invention addresses such needs and sets forth an approach to solve these issues by providing an innovative phase-locked loop for generation of clocks having a 50% duty cycle for application in high-speed memory interfaces, where the high-speed memory interfaces may further have an external long loop delay. The present invention avoids a mandatory requirement for a V-I circuit and a replica circuit. The present invention effectively keeps the closed-loop phase margin insensitive to loop delay time and has improved distributions of VCO gain curves.

In one embodiment the present invention is an innovative integrated circuit capable of generating duty cycle clocks, comprising: a voltage control oscillator (VCO) arranged to control one or more oscillation frequencies, a plurality of pre-dividers interoperably arranged in a predetermined manner with one another and a phase detector to provide balanced frequencies to the phase detector, a divider circuit, a loop filter, and a charge-pump circuit for charging common mode voltages.

In another embodiment the present invention is a hi-speed memory interface device comprising a phase locked loop (PLL) having a voltage control oscillator (VCO) arranged to control one or more oscillation frequencies, a plurality of pre-dividers interoperably arranged in a predetermined manner with one another and a phase detector to provide balanced frequencies to the phase detector, a divider circuit, a loop filter, a charge-pump circuit for charging common mode voltages, and a proportional to absolute temperature (PTAT) block.

In a further embodiment the present invention is an apparatus comprising: a phase detector having a means for comparing phases of a reference signal and a feedback signal, a voltage control oscillators (VCO) means arranged to control one or more oscillation frequencies, a plurality of pre-dividing means interoperably arranged in a predetermined manner with one another, a phase detecting means to provide balanced frequencies to the phase detector, a divider means for dividing a reference clock, a loop filter means, a charge-pump circuit means for charging common mode voltages, a self-biasing means, wherein a quantity of M pre-dividers are positioned, each having a divider ratio of 1/M, before one of an input reference clock or a loop back clock, where M is greater than one.

These and other advantages and features of the present invention will become more apparent from the following detailed description of the preferred embodiments of the present invention when viewed in conjunction with the accompanying drawings.

BRIEF DESCRIPTION OF THE DRAWINGS

FIG. 11 shows the closed-loop response of a PLL without pre-dividers, in accordance with an embodiment of the present invention.

DETAILED DESCRIPTION

The present invention relates generally to electronics circuits, and more particularly to a digital phase-locked loop for application in high-speed memory interfaces.

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 2:
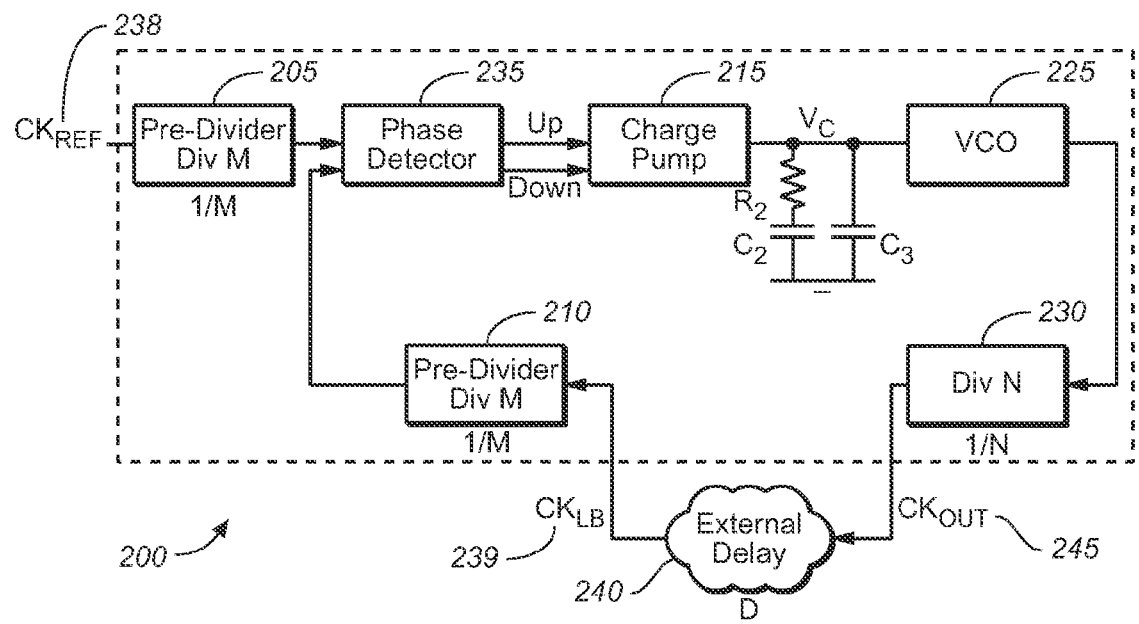
FIG. 2 depicts a block diagram of the innovative PLL of the present invention, in accordance with a preferred embodiment of the present invention.

FIG. 2 depicts a block diagram of the innovative PLL of the present invention, in accordance with a preferred embodiment of the present invention. For clarity and simplicity, in FIG. 2 only single-ended connections are depicted, however other types are understood to be readily used by those skilled in the art.

In FIG. 2, the innovative PLL (IPLL) 200 comprises pre-dividers (set forth at 205 and 210 by example and for illustration only), charge-pump circuit 215, passive RC loop filter 220, voltage-controlled oscillator (VCO) 225, and divider circuit 230. Also set forth in FIG. 2 is a Phase Detector 235 and an External Delay 240. The External Delay block 240 accounts for the total delay time that IPLL output clock (CK$_{OUT}$) encounters at 245 before looping back to the one or more pre-dividers. In the arrangement, divider circuit 230 also has a selectable or predetermined value for the reducing value "N."

The number of pre-dividers totals a quantity of M, wherein each pre-divider has the capability to divide clock rates by a factor of "M," also known as a "divider ratio." As will be appreciated by those skilled in the art, the present invention preferably comprises a plurality of pre-dividers in order to ensure that output frequencies into the phase detector 235 are similar. More particularly, the pre-dividers, separately or mutually, have a dividable clock rate capability (i.e., divider ratio) that may be selectable to a predetermined factor or rate. Additionally, though the pre-dividers 205 and 210 are pictorially depicted to be arranged as in FIG. 2, the location and functional arrangement of pre-dividers may be otherwise arranged, such that the present invention is not limited to the arrangement specifically of FIG. 2. The arrangement of each of the functional blocks is set forth for purposes of clarity and explanation, and it is not implied that the location of any particular pre-divider circuits, divider circuit, or external delay is required to be so configured or in such quantities as set forth in FIG. 2.

An aspect of the present invention, in one preferred embodiment, is that the pre-divider circuits are arranged where one of the plurality of pre-dividers 205 is positioned to receive input reference clock CK$_{REF}$ and the second pre-divider 210 of the plurality is positioned to receive loop back clock input CK$_{LB}$, at 238 and 239 respectively.

Figure 3:
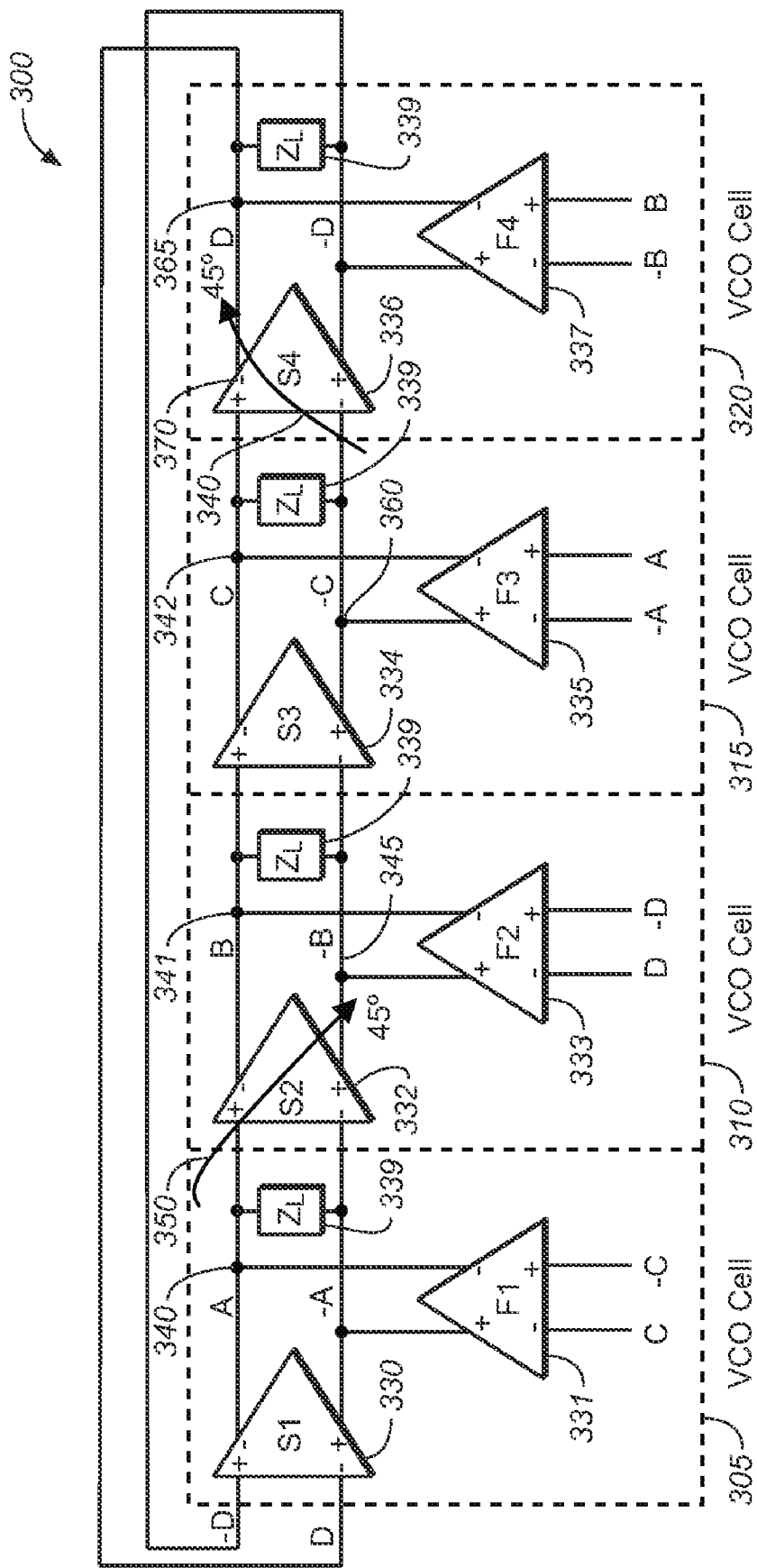
FIG. 3 illustrates a block diagram of a 4-stage differential mutual interpolating VCO, in accordance with an embodiment of the present invention.

FIG. 3 illustrates a block diagram (300) of a 4-stage differential mutual interpolating VCO, in accordance with an embodiment of the present invention.

In FIG. 3, each VCO cell (305, 310, 315, and 320) functions as a delay element to fulfill the required oscillation and also as an interpolator with each of the other VCO cells. The VCO cells may have different timing from one another. The combination of the VCO cells provides for mutual interpolation such as the output at B (341) is determined by that of A (340), whereas the output at C (342) is determined by both B (341) and A (340).

Drivers, which are provided in part to provide a minimum skew across the outputs of the present invention, are located at 330, 331, 332, 333, 334, 335, 336 and 337. Drivers having an "S" designation (e.g., "slow"), such as S1, S2, S3 or S4 (identified as 330, 332, 334, and 336 respectively), are comprised of a predetermined number of transconductance cells, also set forth as G$_{mS}$. Drivers having an "F" designation (e.g., "fast"), such as F1, F2, F3 or F4 (identified as 331, 333, 335, and 337 respectively), are comprised of a predetermined number of transconductance cells, also set forth as G$_{mF}$. The use of the terms "fast" and "slow" are intended to denote the type of paths in the respective VCO, where the "fast" path is also known as the "sub-loopback path." As a result, a slow driver and a fast driver, in combination in a VCO, may serve as an active interpolator.

Further, from FIG. 3, Z$_L$ (at 339) is the resistive load to terminate the interpolated currents from the respective S and F type drivers in a particular VCO. In a conventional VCO, the phase change between stages, for example, from clock signal A to B is 45 degrees. As a result, contradistinctive to the traditional VCO, the phase change of the proposed VCO in the present invention is 45 degrees from signal A (at 340) to –B (at 345), in order to satisfy oscillation criterion, which is 180 degrees apart from the traditional VCO. This is depicted further at 350.

Similarly, the phase change of the proposed VCO in the present invention is –45 degrees from signal –C (at 360) to D (at 365), in order to satisfy oscillation criterion, which is 180 degrees apart from the traditional VCO. This is depicted further at 370.

Figure 4:
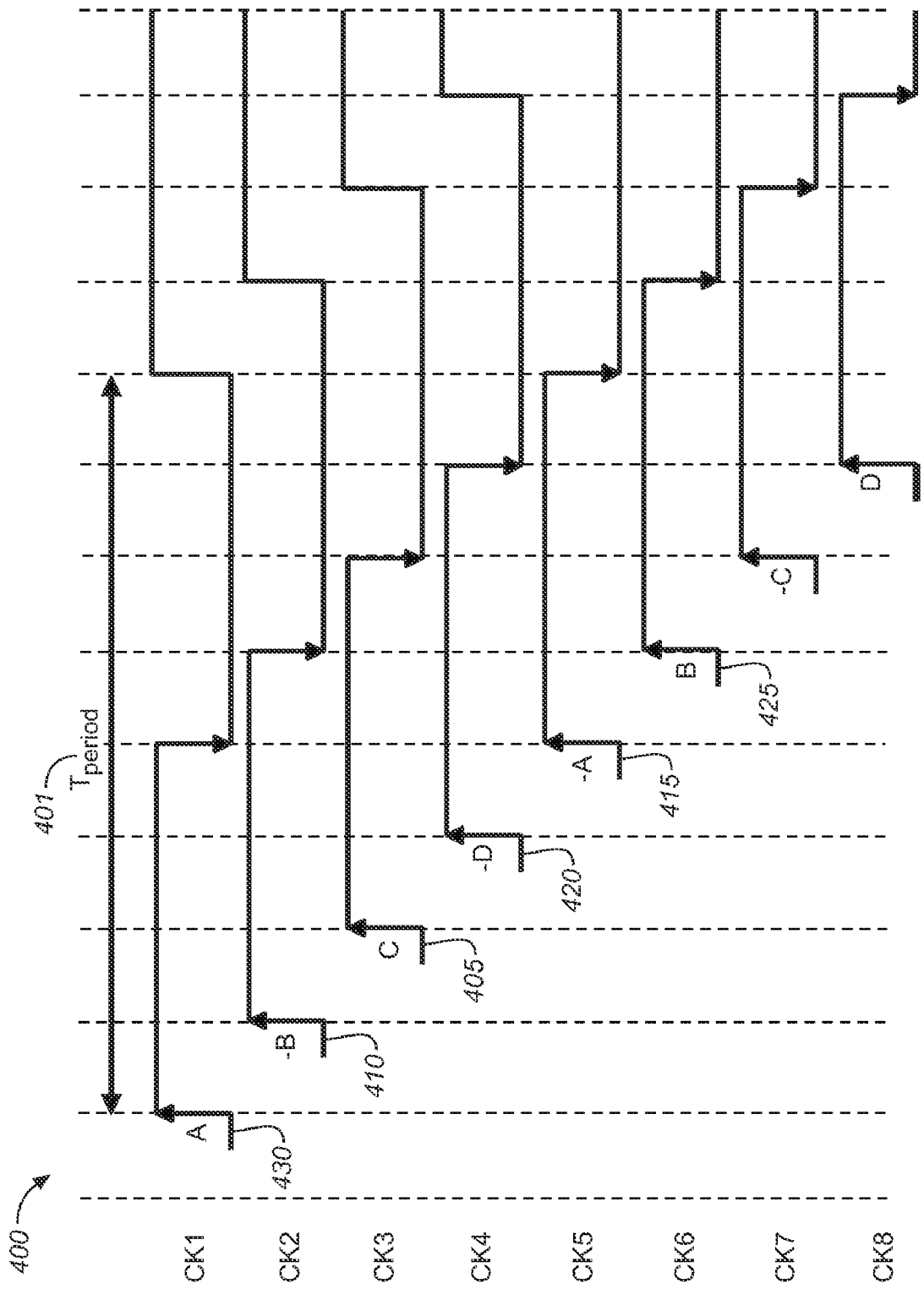
FIG. 4 depicts a phase relationship of the proposed 4-stage voltage-controlled oscillator (VCO) in accordance with an embodiment of the present invention.

FIG. 4 depicts a phase relationship (400) of the proposed 4-stage VCO in accordance with an embodiment of the present invention.

In FIG. 4, the clock phase across an oscillation period, T$_{PERIOD}$, at 401, is not uniquely determined solely by previous stage output, but rather is determined also by the sub-loopback signals. For example, signal C at 405 is generated by interpolating clock signals –B (410) and –A (415). By further example, signal –D (420) results as the interpolated findings from clock signals C (405) and B (425). As a matter of reference in FIG. 3, those skilled in the art will note that signal A (430) differs from signal –A (415) by 180 degrees.

From FIG. 4 in reference with the present invention, it should be appreciated that because of the VCO, eight simultaneous equations for these eight clocks depicted in FIG. 4 may be determined, where these eight simultaneous equations constitute a linear system having sufficient established conditions for eight unknown clock phases. Therefore the determination of each clock phase may be precisely determined by the solution of these eight simultaneous equations. This result is contradistinctive from that of a conventional VCO, where only one loop equation may be obtained for the generated clock phases as there are no subloopback paths associated therewith.

Preferably, the oscillation period (T$_{PERIOD}$) 401 is determined by the equation:

$$T_{PERIOD} = 2NT, \qquad \text{(Equation 1)}$$

where N is the number of stages and T is the delay of each VCO element (cell).

In the conventional VCO, there are no constraints between each clock phase provided that the summation of each VCO element delay favorably satisfies the oscillation criterion.

However, as it widely known, high-speed applications require faster oscillation frequency and parasitic loading therefore is an important factor affecting VCO performance. The present invention is applicable to a high-speed application though a traditional VCO is not so. For instance, in a conventional VCO, a high-speed application is problematic as there is only one constraining equation between clock phases resulting in parasitic loading readily skewing clock phase relationships. Further, with temperature and process variations, the phase relationship in the conventional VCO is not predictably controllable with sufficiency. Consequently, the duty cycle of each clock phase in traditional VCOs is not well defined since the clock phases are not uniformly distributed, which becomes apparent visually on a 360 degree clock phase graphic.

In contrast, given the present invention, the 50% duty cycle sought is automatically reached with the mutual interpolated VCO architecture of the present invention (refer to FIG. 3 for instance of a preferred embodiment). In the present invention, the duty and clock phase relationships are each preserved and done so substantial simultaneously within the VCO of the present invention. The mutual interpolating architecture of the present invention effectively imposes an exact number of constraints on the multiphase clocks generated from the VCO. The mutually interpolated VCO of the present invention acquires oscillation by ensuring clock phases are uniformly distributed across a 360 degree clock phase graphic (i.e., phase or circle graphic) via the solving of the solution of the simultaneous equations discussed above. The unique solution obtained from the substantially simultaneous equations thereby assures a 50% duty cycle for all clock phases in the present invention.

Figure 5:
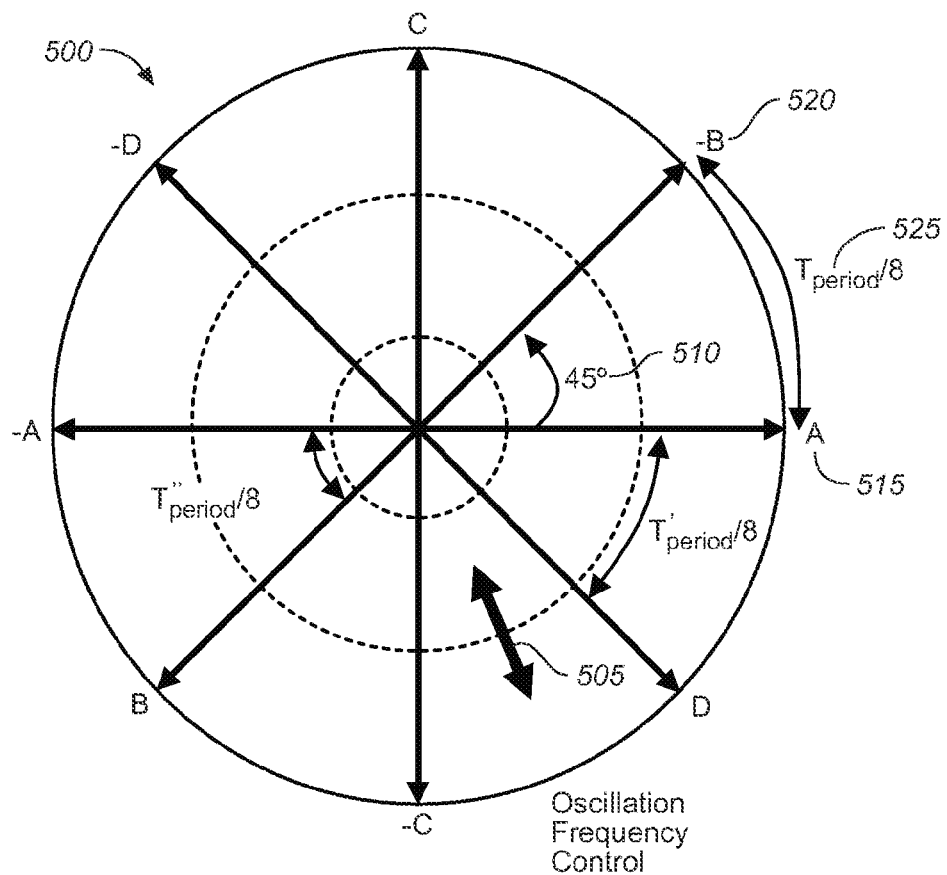
FIG. 5 illustrates the mutual interpolated clock phase relationship for a 4-stage VCO of the present invention, in accordance with an embodiment of the present invention.

FIG. 5 illustrates the mutual interpolated clock phase relationship for a 4-stage VCO of the present invention, in graphical form across a 360 degree phase graphic (500), in accordance with an embodiment of the present invention.

From FIG. 5, it will be appreciated that the larger the radius, the slower the oscillation frequency is, and such can be set forth as:

$$T_{PERIOD} > T'_{PERIOD} > T''_{PERIOD} \quad \text{(Equation 2)}$$

From FIG. 5, the spacing between clock phases is one-eighth (⅛) of a clock period (T), regardless its oscillation frequency, which is reflected by the simultaneously constrained equations of the mutually interpolated VCO of the present invention. Similarly, the phase change of the proposed VCO of the present invention is ready seen to be −45 degrees (510) from signal A (at 515) to −B (at 520) over the portion period of $T_{PERIOD}/8$, in order to satisfy oscillation criterion, which is 180 degrees apart from the traditional PLL. For the present invention, given its mutually interpolated VCO, the radius may be directly controlled by the loop-filter voltage for required oscillation frequency.

Figure 6:
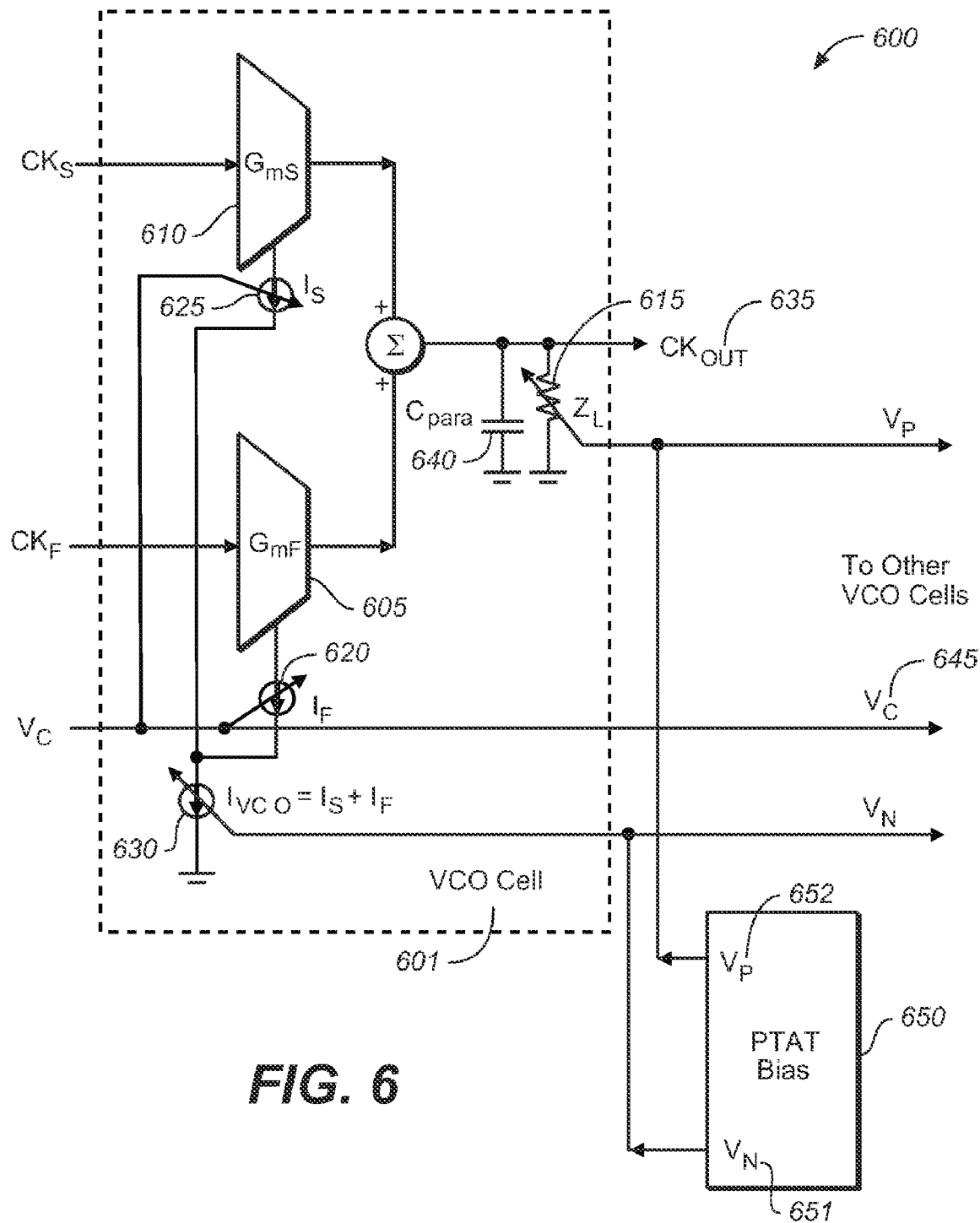
FIG. 6 depicts a block diagram of a mutual interpolated VCO cell, in accordance with an embodiment of the present invention.

FIG. 6 depicts a block diagram (600) of a mutually interpolated VCO cell, in accordance with an embodiment of the present invention. In FIG. 6, single-ended connections are depicted for simplicity, however the present invention is not so limited.

In FIG. 6, in a preferred embodiment, the present invention comprises a VCO cell, 601, having a plurality of transconductors 605 and 610, $G_{mF}$ and $G_{mS}$ respectively, and a resistive load at 615, $Z_L$, to achieve the functional interpolating of the present invention. For clarity, $G_{mF}$ and $G_{mS}$ are the transconductors for fast path (sub-loopback) and the slow path in the mutual interpolated VCO, respectively. $I_F$ (620) and $I_S$ (625) are the biasing current to $G_{mF}$ and $G_{mS}$, respectively, and $I_{VCO}$ (630) is the summation of the biasing currents $I_F$ (620) and $I_S$ (625).

The interpolated clock output ($CK_{OUT}$) 635 is at the transconductor current summing node of $Z_L$ (615). The capacitor $C_{PARA}$ (640) accounts for the loading of circuit parasitic capacitance and the input loading of the next stage as well. $V_C$ (645) is the loop filter control voltage, which adjusts the complementary magnitude of $I_F$ (620) and $I_S$ (625) for oscillation frequency control.

The proportional to absolute temperature block (PTAT) 650 is a biasing circuit designed to accommodate temperature variations in the environment. The output of the PTAT directly controls the biasing current to the VCO cell (at $V_N$ 651) and the resistive load (at $V_P$ at 652). $I_{VCO}$ (630), the summation of the biasing currents $I_F$ (620) and $I_S$ (625), is also controlled by the PTAT 650, where $I_{VCO}$ is a fixed value for a fixed temperature (i.e., predetermined).

For the present invention, in a preferred embodiment as temperature increases, the PTAT 650 increases the biasing current to VCO cell and the effective value of the resistive load is decreased. Therefore, operationally, the output swing of the VCO cell is neither constant and is temperature dependent. As a result, the VCO amplitude is automatically adjusted relationally with temperature variation by the PTAT 650. In this manner, when temperature rises, the VCO amplitude is reduced, in part due to the reduction of $Z_L$.

However, it is known that as temperature increases, the switching characteristic of silicon transistors typically become physically slower and parasitic loading behaves relatively heavier due to weaker driving strength of transistors. Therefore, under the present invention, reducing VCO amplitude has the added benefit of more readily sustaining the required oscillation frequency without causing the circuit to be over driven or driven in excess. The circuit time constant $Z_L \times C_{PARA}$ is therefore designed to a lower value for higher temperatures, thereby maintaining a similar slew rate for clock signals at different temperatures.

Contrastingly, with temperature decreases, transistors typically perform faster switching. Therefore, less bias current to the VCO is required to maintain the necessary oscillation.

In a conventional VCO implementation, a replica circuit is required to maintain the VCO with a constant swing in amplitude. However, as temperature rises, in order to sustain the same oscillation frequency, the circuit would need to be driven harder and extra bias current would need to be provided to the VCO in order to maintain the fixed output swing. Operationally then, the required extra bias current could drive the VCO out of its dynamic range.

Contradistinctively, in contrast to conventional VCO, the IPLL having the VCO of the present invention in a preferred embodiment does not require a replica circuit and consumes less power in high temperature environment. The present invention consumes less power as the oscillation amplitude is decreased by the internal PTAT circuit. Further, the present invention VCO does not require a V-I (voltage to current) converter either The loop filter voltage Vc is connected directly to VCO cells (at 645). Under a fixed temperature condition, the present invention VCO consumes an equal amount of power regardless of its oscillation frequency. Therefore, operationally, the role of the Vc is to adjust the amount of bias current sent to the slow and fast paths of the VCO. The sum of the bias current to the slow and fast paths is uniquely determined by the PTAT circuit.

In contrast, the conventional PLL employs a V-I converter and replica circuit. As a result, the total power delivered to V-I converter plus VCO and replica circuit is dependent on oscillation frequency. Consequently, the VCO gain curves of the traditional PLL exhibit wide variations between different temperatures and process corners. These limitations of the traditional PLL are not limitations of the present invention which demonstrates a tight distribution of VCO gain curves in part since there is no requirement for a V-I converter and also as no replica circuit is required.

Figure 7:
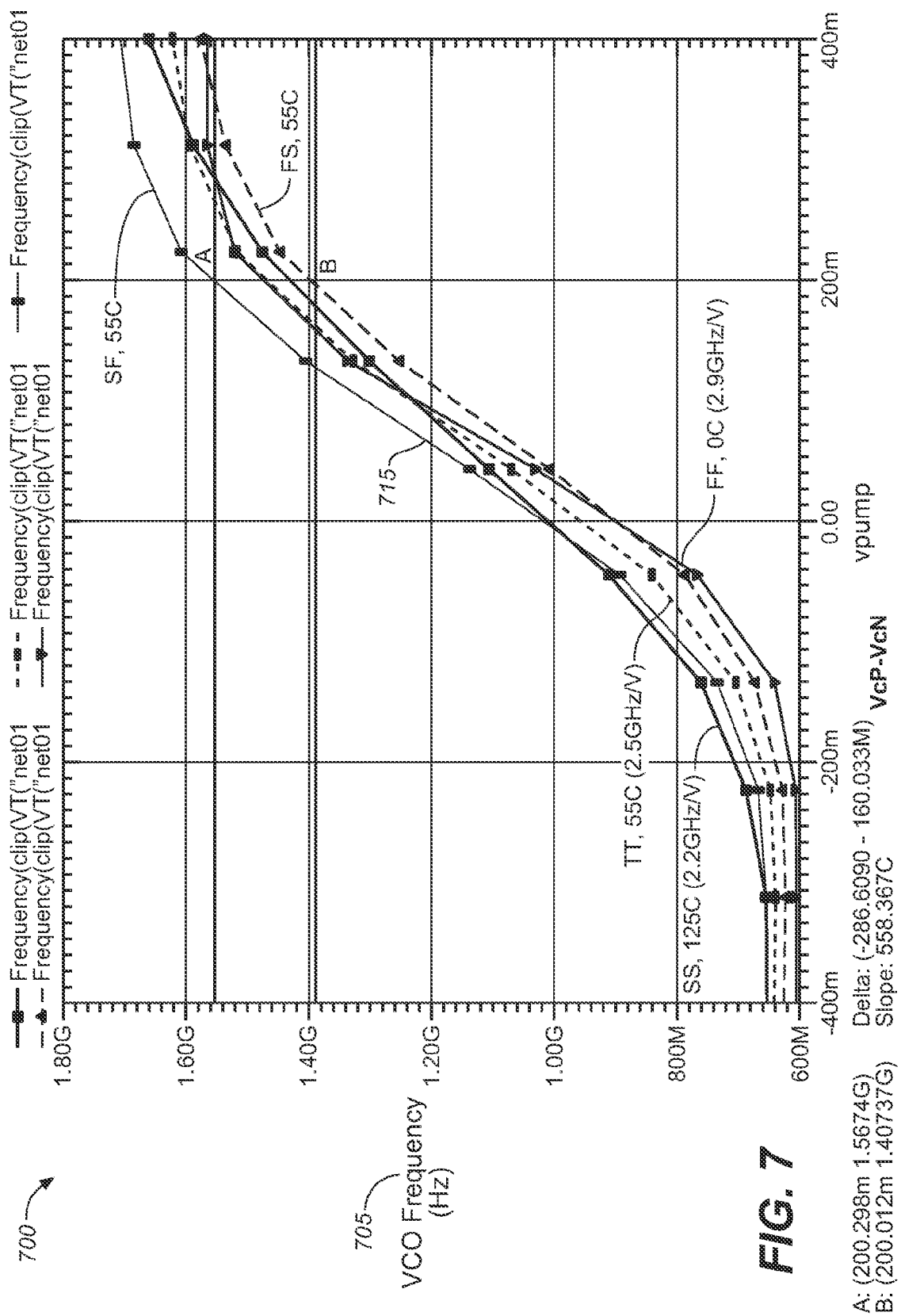
FIG. 7 depicts simulation results of mutual interpolated VCO gain curves having different process corners and temperatures, in accordance with an embodiment of the present invention.

FIG. 7 depicts simulation results 700 of mutual interpolated VCO gain curves having different process corners and temperatures, in accordance with an embodiment of the present invention.

In FIG. 7, the VCO oscillation frequency 705 in comparison to the differential loop filter voltage 710, for the present invention, is depicted. In a preferred embodiment, the target oscillation frequency is 1.2 GHz. As has been previously explained, the IPLL having the VCO of the present invention, does not require a replica circuit, consumes less power in high temperature environment and therefore, the VCO gain curves of the IPLL exhibit narrow variations between different temperatures and process corners. In essence a "tight distribution of VCO gain curves" can be observed at 715.

A tight distribution of VCO gain curves is preferred in the field, primarily as the VCO characteristic is more or less insensitive to process and temperature changes. Operationally then, and more specifically for mass-production implementations, the IPLL yield rate can be enhanced.

Figure 8:
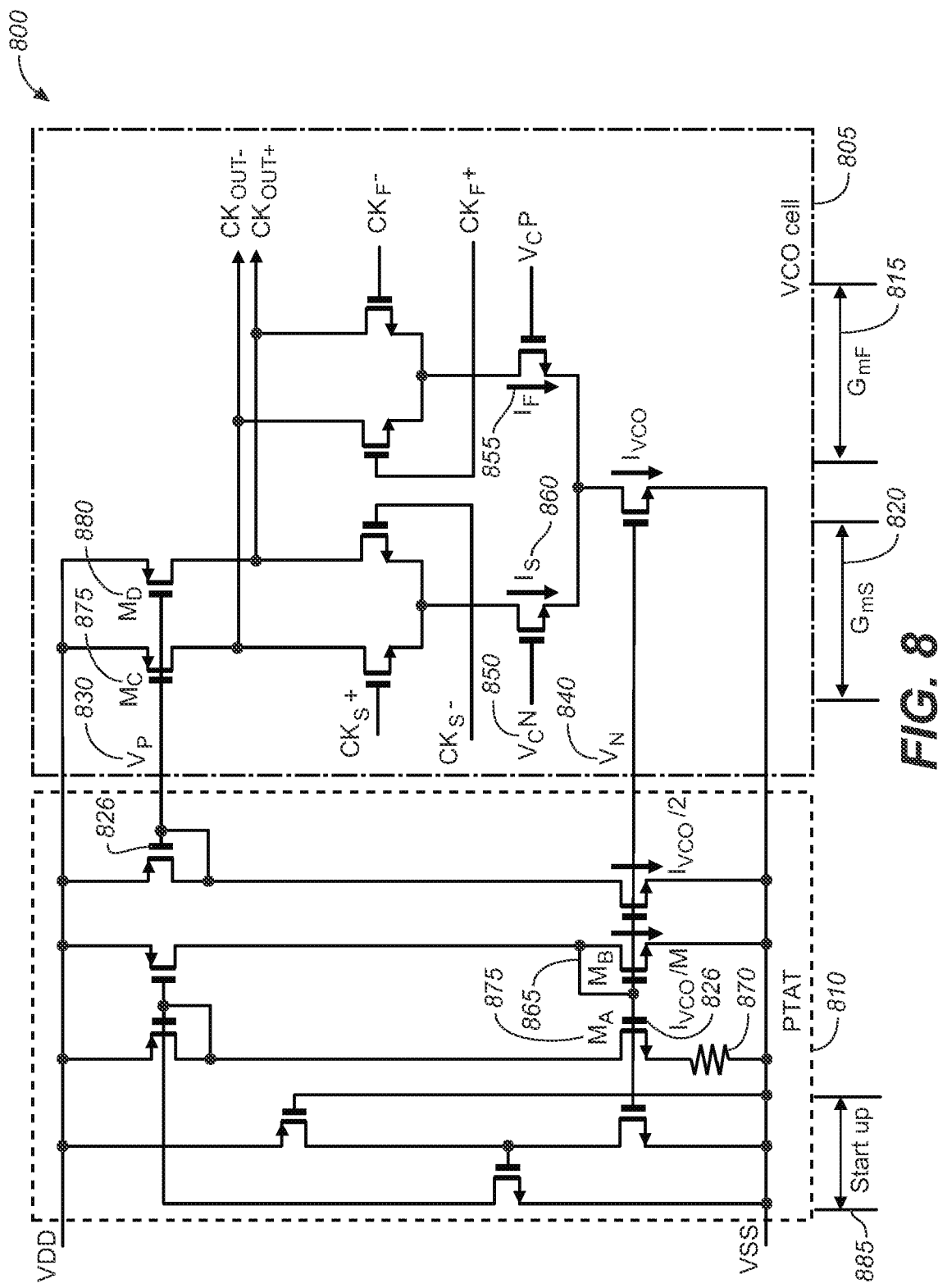
FIG. 8 depicts an exemplary circuit implementation of a mutually interpolating VCO cell and a proportional to absolute temperature block (PTAT) circuit of the present invention, in accordance with an embodiment of the present invention.

FIG. 8 depicts an exemplary circuit implementation 800 of a mutual-interpolating VCO cell 805 and PTAT circuit 810 of the present invention, in accordance with an embodiment of the present invention.

In FIG. 8, two differential pairs implementing $G_{mF}$ and $G_{mS}$ (815 and 820, respectively) serve as the input stage of an interpolator. The summation circuit is implemented by direct connection at the drain nodes of the two differential pairs. The resistive load is implemented by a Positive channel Metal Oxide Semiconductor circuit transistor (PMOS), 826, which is regulated by the voltage Vp, at 830, from PTAT block 810. The tail current is controlled by the voltage $V_N$ at 840. Similarly, and as previous set forth above, the oscillation frequency is controlled by the magnitude of the biasing currents to $G_{mF}$ and $G_{mS}$ which is thereafter adjusted by the loop filter voltage Vc 850.

In a preferred embodiment where the event of $I_F$ 855 being increased to be greater than $I_S$ 860 occurs, the VCO of the present invention shall tend to oscillate at a higher frequency, since the fast path (i.e., sub-loopback) becomes dominant. Similarly, in a further preferred embodiment where the event of $I_S$ increases above $I_F$ occurs, the VCO of the present invention oscillates at a slower frequency primarily as the slow path contributes more to the oscillation.

The present invention is better suited to the high-speed applications needs for the reasons set forth as well as since the IPLL does not necessitate the need for a V-I converter for frequency tuning in the VCO as a traditional PLL would. Therefore the IPLL VCO cell architecture is able to simultaneously act in providing a delay element and an interpolation capability.

The PTAT circuit 810 is realizable by using conventional constant transconductance biasing techniques, where the transconductance of transistor $M_B$ 865 is uniquely determined by the value of $R_B$ 870 and the device size ratio as between $M_A$ 875 and $M_B$ 865. As temperature increases in the present invention, the biasing current through $M_B$ will also increase in order to keep constant transconductance for $M_B$. In addition, due to the increased current, the effective impedance of PMOS MC 875 and MD 880, is reduced. Similarly, the biasing current sent to the VCO is also increased and the VCO of the present invention has the ability to acquire oscillation at a high temperature simultaneously as it acquires oscillation in a low temperature environment. As a result, the VCO gain curves of the present invention demonstrate a tighter distribution across temperatures than traditional PLLs.

In a further preferred embodiment, a start-up circuit 885 is set forth in FIG. 8. The zero biasing at start up is overcome by the start up circuit 885. Without 885, the PTAT circuit may stay in zero biasing condition after power on. In short, zero biasing is the condition we want to avoid. Therefore, we add a "start up" circuit to prevent/overcome zero biasing. The start-up circuit 885 works only during power on.

The start-up circuit is provided in a preferred embodiment to overcome a situation possible in a traditional circuit configuration where the transistors of the PTAT each have zero biasing current at the time of start-up ("zero biasing start-up"). Given the arrangement of the start-up circuit, a condition such as zero biasing start-up is in the PTAT circuit, in part as the PTAT and start-up circuits provide a global bias to VCO cells, are implemented only once, but the interpolator (i.e., $G_{mF}$ and $G_{mS}$) is repeated four times for a complete VCO design.

Figure 9:
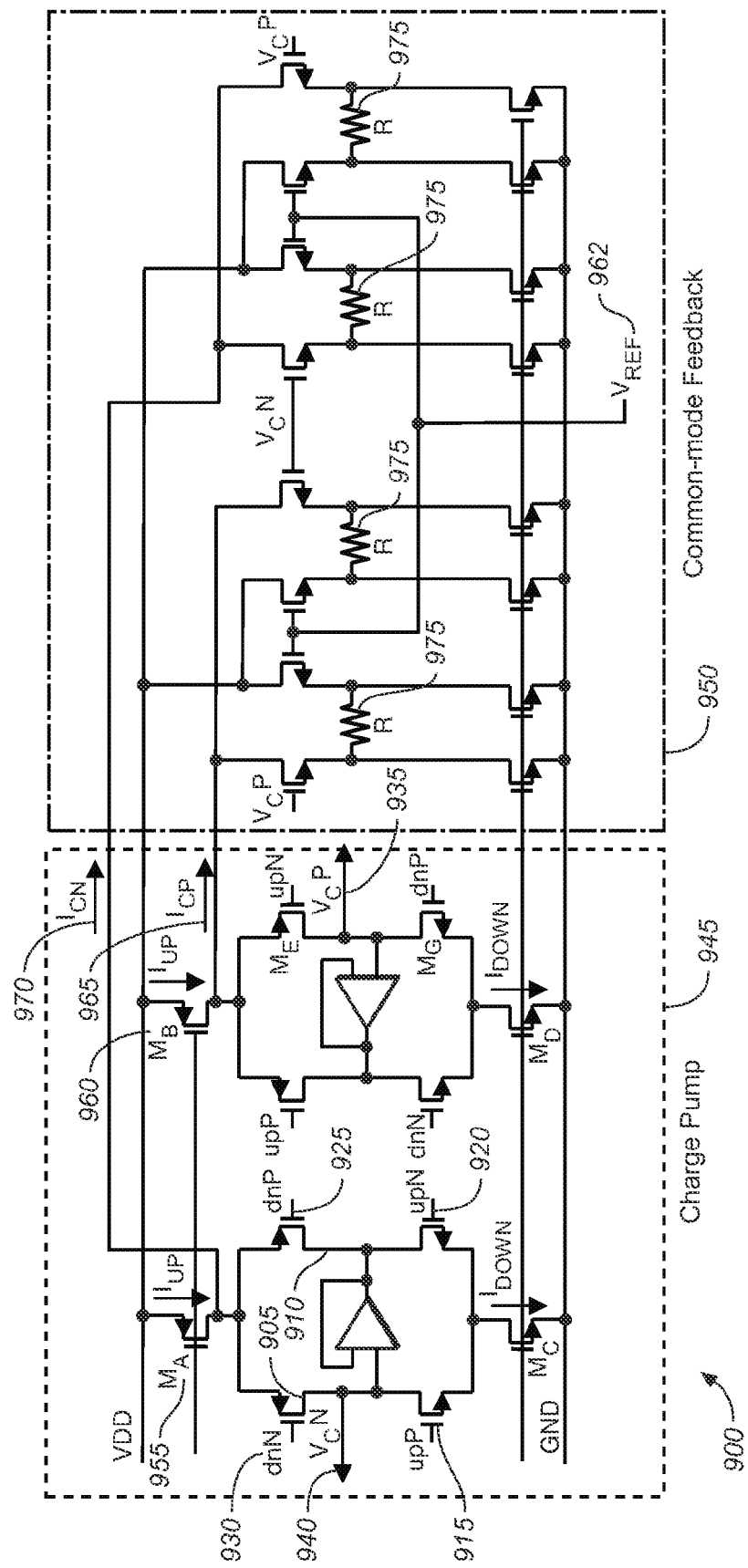
FIG. 9 depicts an implementation of a differential charge-pump circuit of the present invention in accordance with an embodiment of the present invention.

FIG. 9 depicts an implementation of a differential charge-pump circuit 900 of the present invention in accordance with an embodiment of the present invention.

The charge-pump circuit 945 comprises a plurality of differential pairs of an N-channel Metal Oxide Semiconductor circuit transistor (NMOS), and PMOS, connected back-to-back respectively. Signals upP, upN, dnP, and dnN (915, 920, 925, and 930, respectively) denote the differential UP and DOWN controls necessary in order to increase or decrease the loop filter voltages (also used as common mode voltages) $V_CP$ 935 and $V_CN$ 940. A unit-gain amplifier is also set forth in a preferred embodiment to provide for equalizing the replica branch of the charge-pump circuit 945, such that the potential at the replica branch tracks the true loop filter voltage VcP 935 or VcN 940.

Contradistinctive from the present invention, a common mode feedback circuit in a conventional differential circuit employs a voltage-mode approach. In the present invention, a current-mode approach (via the common-mode feedback circuit or common mode circuit, 950) is employed to control common-mode voltage of the differential charge-pump circuit 945.

The common mode circuit employs an open-drain approach in the differential transistors, where its drain nodes support the shunt paths to the biasing current sources, comprised of transistors $M_A$ 955 and $M_B$ 960. By comparing the output common mode voltage of VcP 935 and VcN 940 to a fixed reference voltage $V_{REF}$ 962, the common mode circuit 950 adjusts the magnitudes of the currents $I_{CP}$ 965 and $I_{CN}$ 970 through the feedback mechanism of the common mode circuit 950. As a result, the output common mode voltage of VcP and VcN follows the value set by $V_{REF}$.

The present invention has benefits which greatly exceed those of the traditional PLL approach, particularly given the process mismatches which are unavoidable in semiconductor manufacturing.

For instance, the present invention, in a preferred embodiment, comprises a current mode approach (also used as current mode architecture) which overcomes the mismatch between current sources and the parasitic loading effect.

For instance, a known effect is that where the voltage-mode approach is employed for common-mode feedback, the current flows in transistors $M_A$ and $M_B$ (or other paired combinations, for example,) could be different due to mismatch. As a result, charge-pump currents for charging up and charging down VcP or VcN are offset and result in a mismatch. This mismatch of in charge-pump current induces an offset voltage in the loop-filter voltages, when the traditional PLL attains a lock state. Time-domain jitter in the traditional PLL is consequently developed due to this offset, causing the traditional PLL to not be able to precisely track to the reference clock.

In contrast, for the present invention, the current mode architecture eliminates the potential mismatch issue as discussed previously, in part because the charge-pump current mismatch can be compensated for independently by the current flows in $I_{CP}$ and $I_{CN}$ through the feedback mechanism. The common mode feedback circuit (also used as common mode architecture) of the present invention performs linearly even when there is a large potential difference between VcP and VcN. The source-degenerate resistor R 975 in the common-mode feedback block serves the purpose to extend the circuit's linear range and reduce feedback gain, thereby reserving sufficient phase margin to avoid oscillation in the common mode feedback loop.

Additionally, the present invention may also be used to extend PLL functionality to compensate for external loop delay, provided the effect of loop delay time to PLL performance (as in FIG. 2) can be quantified.

Stepwise, the closed-loop response $H_{CL}(S)$ of a PLL without taking into account the external delay time is determined as:

$$H_{CL}(S)=H_{OP}(S)/(1+(1/N)H_{OP}(S)), \text{ where,} \quad \text{(Equation 3)}$$

$H_{OP}(S)$ is the open loop transfer function of the PLL; and N is the divide-down counter ratio.

In the case where the PLL does not have a pre-divider M but does include external delay loop, the closed-loop transfer function of the PLL is, $$H_{CLD}(S)=H_{OP}(S)/(1+(D/N)H_{OP}(S)), \text{ where,} \quad \text{(Equation 4)}$$

The delay D is the Laplace transform of external delay time $T_d$ in units of seconds, such that:

$$D=e^{-STd}=1-ST_d+ST_d^2/2+ \quad \text{(Equation 5)}$$

Comparing equations (3) and (4), the delay D has the effect to shift the pole locations defined in $H_{CL}(S)$. $H_{CLD}(S)$ however may lose phase margin and exhibit peaking in frequency-domain if $T_d$ is greater than a clock period.

Figure 10A:
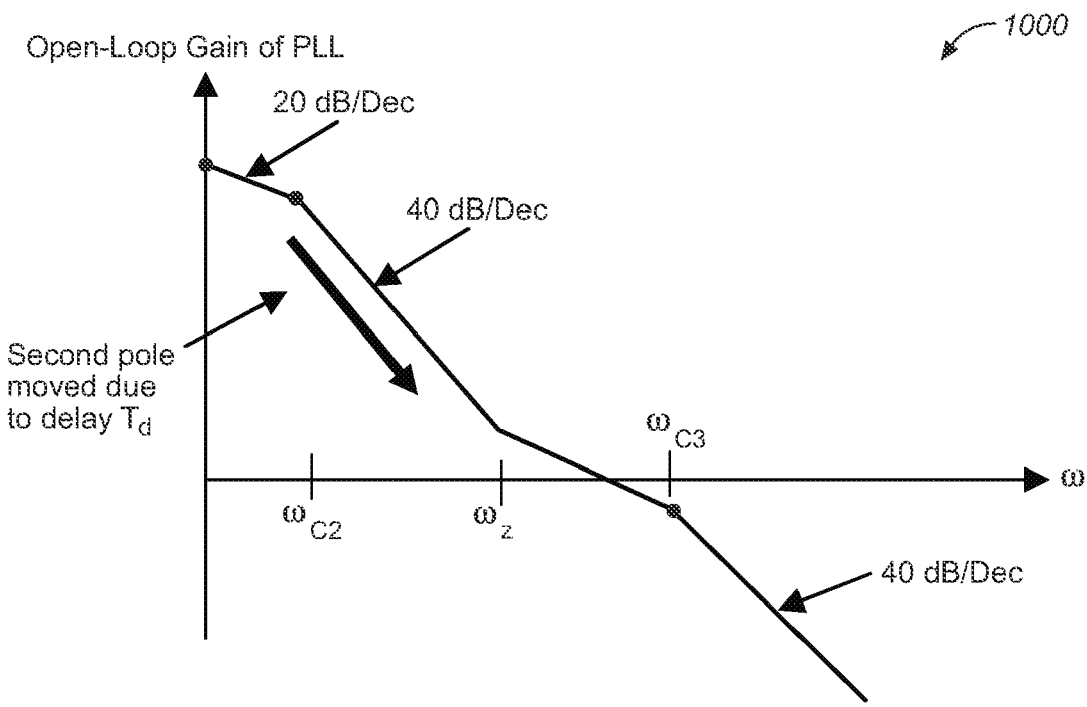
FIG. 10 sets forth an assessment of the effect of delay D to $H_{CLD}(S)$, in accordance with an embodiment of the present invention.
Figure 10B:
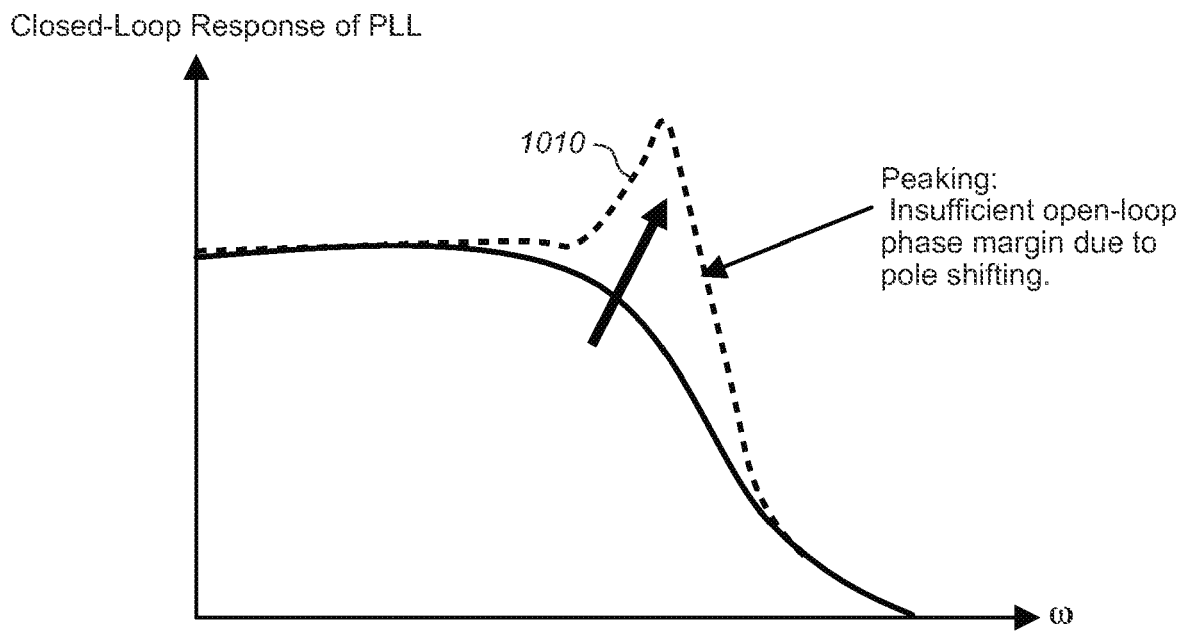

FIG. 10 sets forth an assessment of the effect of delay D to $H_{CLD}(S)$, as depicted in figure set 1000, in accordance with an embodiment of the present invention.

It can be shown that the traditional peaking of $H_{CLD}(S)$ is non-linearly dependent on delay time $T_d$. Traditionally, as $T_d$ increases, the peaking consequently increases and the closed-loop PLL becomes unstable, at 1010. The traditional PLL is either likely going to generate a lot of clock jitter or shall completely fail to lock the reference clock in these scenarios. Unfortunately, in today's high-speed memory applications, a faster clock rate is required. However, the external loop delay time may exceed much more than one clock period, but this amount of delay time can be compensated, as is known in the art, by using a very large capacitor in the loop filter to narrow down the overall PLL closed-loop bandwidth. However, this kind of approach has drawbacks and limitations, as such would require one or more of a great die size for a capacitor or an external capacitor component. Additionally, the reduction of PLL closed-loop bandwidth due to the larger capacitor could increase time-domain jitter, since the PLL needs longer time to correct its VCO phase error. However, these limitations are not present in the present invention.

The present invention, in a preferred embodiment, is arranged so as to reduce loop delay effect using a pre-divider approach not requiring a large capacitor.

The complete closed-loop transfer function $H_{CLX}(S)$ with pre-dividers M then is:

$$H_{CLX}(S)=H_{OP}(S)/(1+(D/(N*M))H_{OP}(S)). \quad \text{(Equation 6)}$$

As in Equation 6, the inclusion of pre-divider M reduces the effect of D by M times. As a result, external loop delay is less effective to shift the pole locations of the PLL defined originally in $H_{CL}(S)$. Therefore, comparatively, the present invention with pre-dividers is able to operate and tolerate longer loop delay without triggering stability and jitter issues. Operationally, the present invention is able to achieve this result since the IPLL pole becomes less sensitive to loop delay time.

For example, in Equation 6, if M is equal to 4, the IPLL can theoretically tolerate loop delays being four (4) times longer without scarifying IPLL performance. Operation of $H_{CLX}(S)$ with same output clock frequency as in $H_{CLX}(S)$ both input and feedback path should have a pre-divider M, as is pictorially demonstrated in FIG. 2.

FIG. 11 shows the closed-loop response of a PLL without pre-dividers 1100, in accordance with an embodiment of the present invention.

In FIG. 11, the target PLL operating frequency is 200 MHz. The clock period is therefore 5 ns. As is visible in FIG. 11 the closed-loop response starts to exhibit overshoot as the external loop delay is 5 ns, generally at 1110. From FIG. 5, a large spike is graphically shown when the delay time reaches 10 ns, which is equivalent to two clock periods, generally at 1115. At 1115, phase margin is lost and a stability problem arises.

Figure 12:
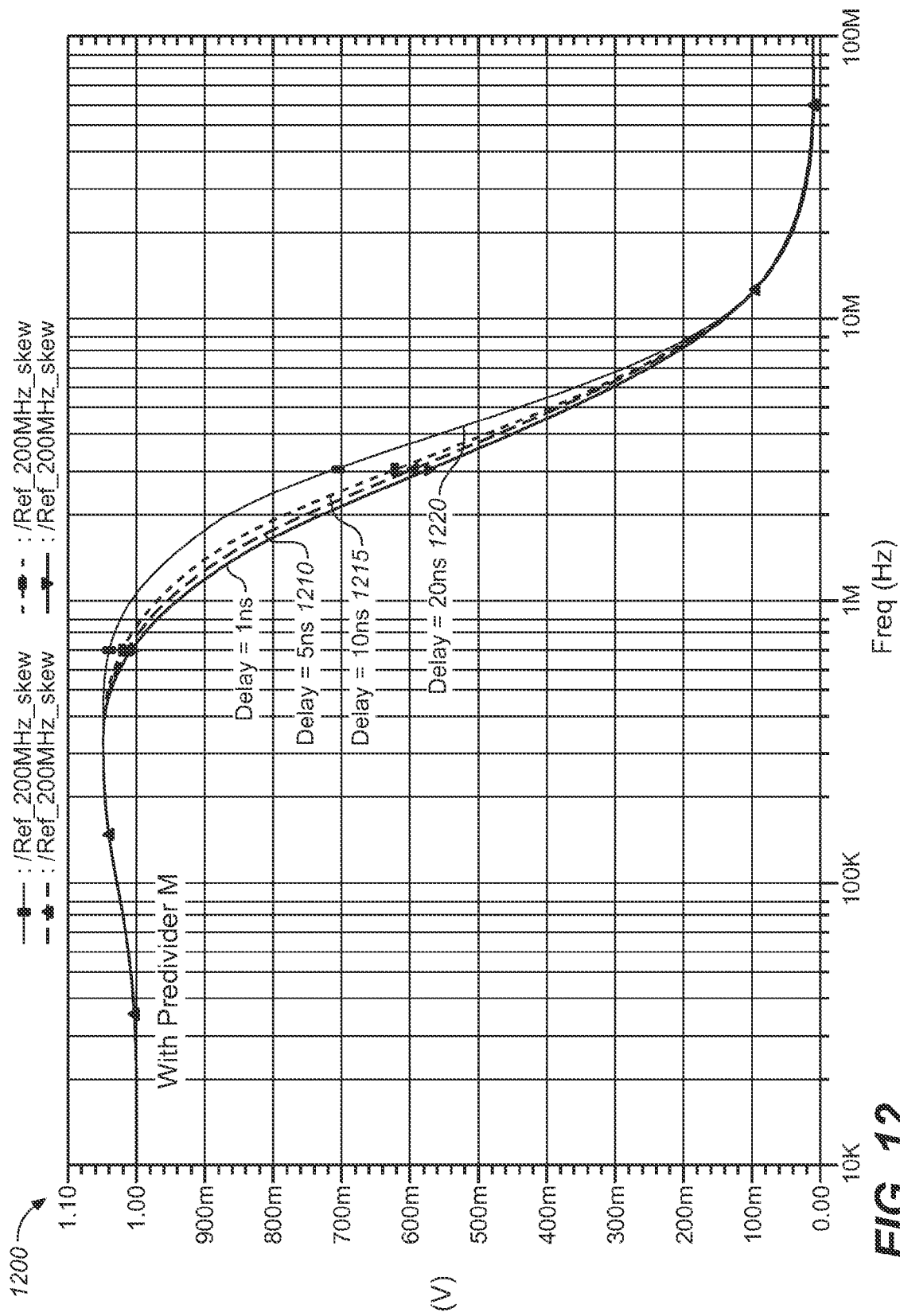
FIG. 12 shows the closed-loop response of a PLL with pre-dividers, in accordance with an embodiment of the present invention.

FIG. 12 shows the closed-loop response of a PLL with pre-dividers 1200, in accordance with an embodiment of the present invention.

In FIG. 12, the target PLL operating frequency is 200 MHz. The clock period is therefore 5 ns. The pre-divider value used FIG. 12 is 4. As is visible in FIG. 12, there is virtually no overshot at 5 ns (generally at 1210), or at 10 ns (generally at 1215). Additionally, from FIG. 12, it is apparent that delay time can be prolonged to 20 ns, generally at 1220, equivalent to four clock cycles, without showing any overshoot.

Figure 1:
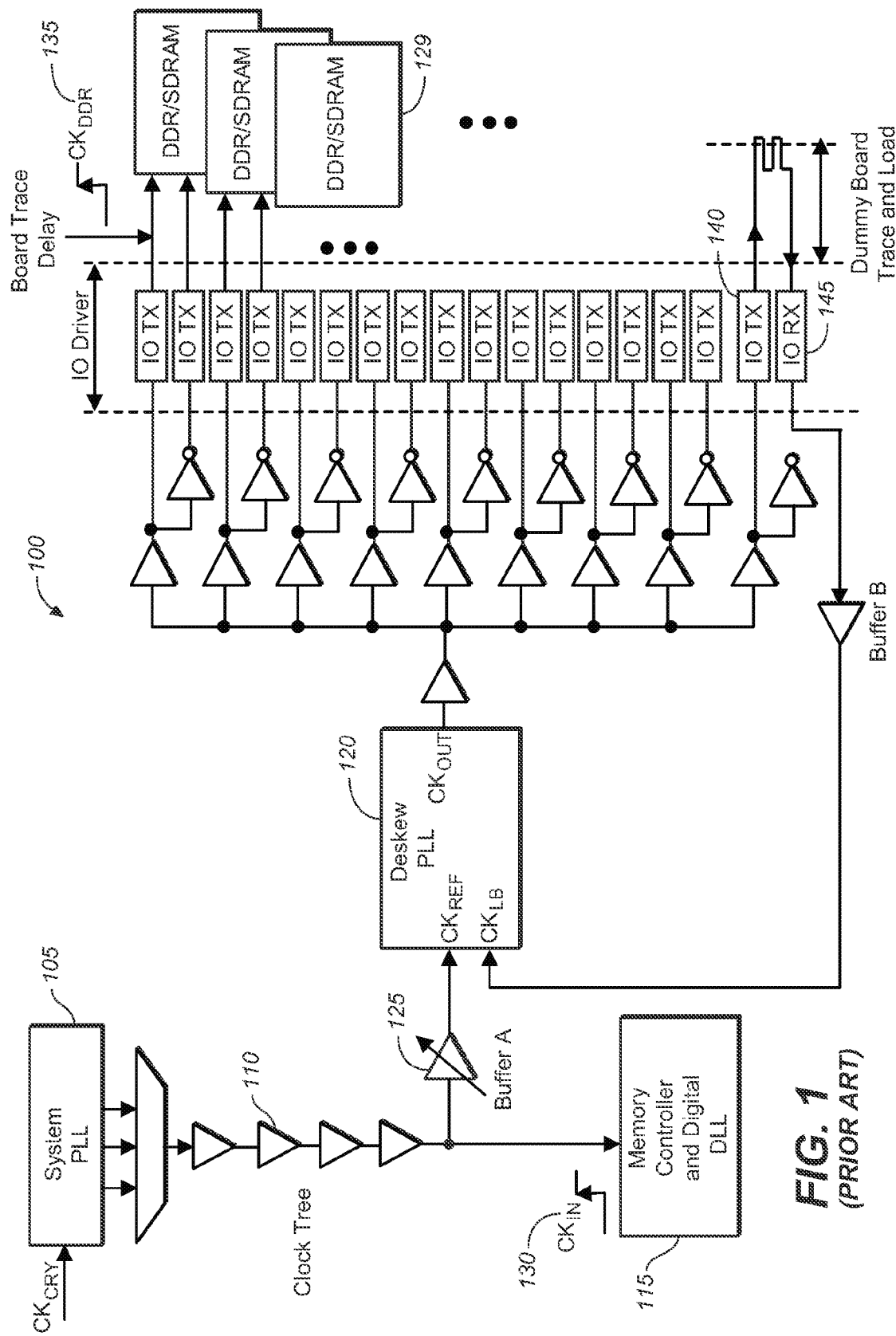
FIG. 1 depicts a conventional PLL used in a typical system with a memory interface.

The IPLL is therefore flexible in applications such as system PLL and deskew PLL situations as is shown in FIG. 1. Both types of PLL can share the same architecture for high-speed memory interface applications with the present invention.

In general, a digital IPLL may be designed to implement one, multiple, or all of the techniques described herein to achieve good performance. The digital PLL may be implemented in one or more integrated circuits and may be advantageously used for a system-on-a-chip design. The digital IPLL may also be implemented in a wireless device (e.g., a cellular phone) and other electronic devices, of which the term devices is intended to be generally encompassing without limitation. Various aspects and embodiments of the invention have been described in detail previously.

The term VCO may mean one or more VCOs separately or in combination, be they sequential, serial or parallel, phased or staged, and such term is also intended to mean a functional VCO cell, device, circuit equivalent or software code, without limitation. As used herein, the term circuit may also be interchanged functionally with that of microcode of software and its equivalents.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An integrated circuit capable of generating duty cycle clocks, comprising: a voltage controlled oscillator (VCO) comprises of a plurality of differential mutually interpolating voltage control oscillator cells (VCO cells) arranged to control one or more oscillation frequencies, wherein the plurality of VCO cells may have different timing from one another due to a precise determination of each duty cycle clock phase based on the solving of a plurality of simultaneous equations, and wherein the combination of the VCO cells provides for the mutual interpolation; a predetermined plurality of pre-dividers, a phase detector to provide balanced frequencies, a divider circuit, a loop filter, and a charge-pump circuit for charging common mode voltages.

2. The circuit of claim 1, further comprising the predetermined plurality of pre-dividers being of a quantity M, wherein each pre-divider has a divider ratio of 1/M and is positioned before one of an input reference clock or a loop back clock.

3. The circuit of claim 2, wherein a loop delay effect is reduced in relation to the divider ratio.

4. The circuit of claim 3, further comprising an external delay block which adjusts an output clock in connection to the divider circuit, in relation to a total delay time.

5. The circuit of claim 4, wherein a balanced up and down charging current is received by the loop filter.

6. The circuit of claim 5, further being configured with a high-speed memory interface device having an external long loop delay.

7. The circuit of claim 4, wherein the VCO consumes a predetermined current amount in relation to a predetermined temperature, wherein a mismatch in the charge pump circuit is minimized and an output swing of the VCO is automatically adjusted by a self-bias circuit.

8. The circuit of claim 7, further comprising a biasing circuit functional to minimize effects of temperature variations in an environment.

9. The circuit of claim 8, wherein the biasing circuit is a proportional to absolute temperature (PTAT) block wherein the (PTAT) block controls a biasing current for the VCO and a resistive load.

10. The circuit of claim 8, further comprising a self-biased circuit so as to constrain an amount of current to be consumed by the VCO independent of the VCO's oscillating frequency.

11. The circuit of claim 9, wherein the (PTAT) block determines a sum of bias currents to a slow path and a fast path of the circuit.

12. The circuit of claim 9, wherein the plurality of VCO cells are arranged so as to directly receive one or more respective differential loop filter voltages.

13. The circuit of claim 9, wherein VCO gain curves of the circuit are tightly distributed independent of temperature range variations or process corners.

14. The circuit of claim 9, wherein the duty cycle clock is at least 45%.

15. The circuit of claim 14, wherein the duty cycle clock is within a range of five percent of 50%.

16. A hi-speed memory interface device comprising a phase locked loop (PLL) having a voltage controlled oscillator (VCO) comprises of a plurality of differential mutually interpolating voltage control oscillator cells (VCO cells) arranged to control one or more oscillation frequencies, wherein the plurality of VCO cells may have different timing from one another due to a precise determination of each duty cycle clock phase based on the solving of a plurality, of simultaneous equations, and wherein the combination of the VCO cells provides for the mutual interpolation; a predetermined plurality of pre-dividers, a phase detector to provide balanced frequencies, a divider circuit, a loop filter, a charge-pump circuit for charging common mode voltages, and a proportional to absolute temperature (PTAT) block.

17. The device of claim 16, further comprising the predetermined plurality of pre-dividers being of a quantity M, wherein each pre-divider has a divider ratio of 1/M and is positioned before one of an input reference clock or a loop back clock, wherein a loop delay effect is reduced in relation to the divider ratio.

18. The device of claim 17, wherein the device comprises a current mode architecture where currents ICP and ICN are individually adjusted to avoid mismatch.

19. The device of claim 18, wherein a balanced up and down charging current is received by the loop filter.

20. The device of claim 19, further being configured with a high-speed memory interface device having an external long loop delay.

21. The device of claim 19, wherein the VCO utilizes a predetermined amount of current in direct relation to a predetermined temperature, and an output swing of the VCO is automatically adjusted by the PTAT.

22. The device of claim 21, wherein the PTAT determines a sum of bias currents to a slow path and a fast path of the circuit.

23. The device of claim 22, wherein the plurality of VCO cells are arranged so as to directly receive one or more respective differential loop filter voltages.

24. The device of claim 23, wherein the duty cycle clock is at least 45%.

25. The device of claim 24, wherein the duty cycle clock is approximately 50%.

26. A hi-speed memory device have an interface and an external long loop delay, comprising: a phase locked loop (PLL) having a voltage controlled oscillator (VCO) comprises of a plurality of differential mutually interpolating voltage control oscillator cells (VCO cells) arranged to control one or more oscillation frequencies, wherein the plurality of VCO cells may have different timing from one another due to a precise determination of each duty cycle clock phase based on the solving of a plurality of simultaneous equations, and wherein the combination of the VCO cells provides for the mutual interpolation; a divider circuit, a loop filter, a charge-pump circuit for charging common mode voltages, a self-biasing current, and a plurality of pre-positioned pre-dividers being of a quantity M, wherein each pre-divider has a divider ratio of 1/M and is positioned before one of an input reference clock or a loop back clock, wherein a loop delay effect is reduced in relation to the divider ratio.

27. The device of claim 26, wherein the device comprises: a current mode architecture where currents ICP and ICN are individually adjusted to avoid mismatch, and a balanced charging current received by the loop filter.

28. The device of claim 27, wherein the VCO utilizes a predetermined amount of current in direct relation to a predetermined temperature, and an output swing of the VCO is automatically adjusted by the self-biasing current, and wherein the self-biasing current determines a sum of bias currents to a slow path and a fast path of the circuit.

29. The device of claim 28 wherein the self-biasing current is a PTAT.

30. The device of claim 29, wherein the plurality of VCO cells are arranged so as to directly receive one or more respective differential loop filter voltages.

31. The device of claim 29, wherein the duty cycle clock is at least 40%.

32. The device of claim 29, wherein the duty cycle clock is approximately 50%.

33. An apparatus comprising: a phase detector for comparing phases of a reference signal and a feedback signal, a plurality of differential mutually interpolating voltage control oscillator cells (VCO cells) means arranged to control one or more oscillation frequencies, wherein the plurality of VCO cells may have different timing from one another due to a precise determination of each duty cycle clock phase based on the solving of a plurality of simultaneous equations, and wherein the combination of the VCO cells provides for the mutual interpolation; a phase detecting means to provide balanced frequencies, a divider means for dividing a loop-back clock, a loop filter means, a charge-pump circuit means for charging common mode voltages, a self-biasing means, wherein a quantity of M pre-dividers are positioned, each having a divider ratio of 1/M, before one of an input reference clock or a loop back clock, where M is greater than one, wherein the apparatus generates a duty cycle clock of approximately 50%.

34. The apparatus of claim 33 wherein the apparatus is a wireless computer.

35. An improved PLL having integrated circuit capable of generating duty cycle clocks, comprising: a plurality of differential mutually interpolating voltage control oscillator cells (VCO cells) arranged to control one or more oscillation frequencies, wherein the plurality of VCO cells may have different timing from one another due to a precise determination of each duty cycle clock phase based on the solving of a plurality of simultaneous equations, and wherein the combinations of the VCO cells provides for the mutual interpolation; a phase detector to provide balanced frequencies to the phase detector, a divider circuit, a loop filter, and a charge-pump circuit for charging common mode voltages, wherein the improved PLL is devoid of a voltage to a current (V-I) circuit.

36. The circuit of claim 1, further comprising the plurality of differential mutually interpolating voltage control oscillator cells (VCO cells) means is a four-stage differential mutually interpolating voltage control oscillator (VCO) wherein the plurality of VCO cells may have different timing from one another due to a precise determination of eight unknown duty cycle clock phases based on the solving of eight simultaneous equations.

37. The device of claim 16, further comprising the plurality of differential mutually interpolating voltage control oscillator cells (VCO cells) means is a four-stage differential mutually interpolating voltage control oscillator (VCO) wherein the plurality of VCO cells may have different timing from one another due to a precise determination of eight unknown duty cycle clock phases based on the solving of eight simultaneous equations.

38. The apparatus of claim 33, further comprising the plurality of differential mutually interpolating voltage control oscillator cells (VCO cells) means is a four-stage differential mutually interpolating voltage control oscillator (VCO) wherein the plurality of VCO cells may have different timing from one another due to a precise determination of eight unknown duty cycle clock phases based on the solving of eight simultaneous equations.

* * * * *